United States Patent
Mauder et al.

(10) Patent No.: US 11,346,880 B2
(45) Date of Patent: May 31, 2022

(54) POWER SEMICONDUCTOR DEVICE WITH INTEGRATED CURRENT MEASUREMENT

(71) Applicant: Infineon Technologies Austria AG, Villach (AT)

(72) Inventors: Anton Mauder, Kolbermoor (DE); Thomas Kimmer, Pörtschach (AT); Wolfgang Raberg, Sauerlach (DE); Mitja Rebec, Villach (AT)

(73) Assignee: Infineon Technologies Austria AG

( * ) Notice: Subject to any disclaimer, the term of this patent is extended or adjusted under 35 U.S.C. 154(b) by 78 days.

(21) Appl. No.: 16/871,584

(22) Filed: May 11, 2020

(65) Prior Publication Data
US 2020/0363463 A1 Nov. 19, 2020

(30) Foreign Application Priority Data
May 14, 2019 (DE) .......................... 102019003373.6

(51) Int. Cl.
*G01R 31/26* (2020.01)
*H01L 23/373* (2006.01)
*G01R 1/00* (2006.01)

(52) U.S. Cl.
CPC ........ *G01R 31/2621* (2013.01); *H01L 23/373* (2013.01)

(58) Field of Classification Search
CPC ........ H01L 21/00; H01L 2221/00; H02J 1/00; G01R 1/00
See application file for complete search history.

(56) References Cited

U.S. PATENT DOCUMENTS

| | | | |
|---|---|---|---|
| 9,564,578 B2 | 2/2017 | Meyer et al. | |
| 9,678,173 B2 | 6/2017 | Serrato | |
| 10,027,250 B2 | 7/2018 | Nomura et al. | |
| 2005/0270745 A1* | 12/2005 | Chen | H01F 27/2804 361/707 |
| 2014/0197795 A1* | 7/2014 | Crebier | H02J 7/35 320/118 |
| 2015/0311803 A1* | 10/2015 | Schaemann | H02M 3/33507 315/210 |

(Continued)

FOREIGN PATENT DOCUMENTS

| | | |
|---|---|---|
| DE | 102014106133 A1 | 11/2014 |
| DE | 102016111248 A1 | 12/2016 |
| DE | 112015003117 | 3/2017 |

*Primary Examiner* — Jermele M Hollington
*Assistant Examiner* — Temilade S Rhodes-Vivour
(74) *Attorney, Agent, or Firm* — Design IP

(57) ABSTRACT

A package-integrated power semiconductor device is provided, which includes at least one power transistor coupled to a current path, a current measurement device and a package. The current measurement device is electrically insulated from and magnetically coupled to the current path. The current path and the current measurement device are arranged so as to enable the current measurement device to sense the magnetic field of a current flowing through the current path. The at least one power transistor, the current measurement device, and the current path are arranged inside the package. Further, a power module assembly including the package-integrated power semiconductor device as well as a method of operating the package-integrated power semiconductor device are provided.

17 Claims, 7 Drawing Sheets

(56) References Cited

U.S. PATENT DOCUMENTS

| | | | |
|---|---|---|---|
| 2015/0365084 A1* | 12/2015 | Hirler | H03K 17/165 |
| | | | 327/382 |
| 2018/0206359 A1* | 7/2018 | McPherson | H01L 25/072 |
| 2018/0329002 A1* | 11/2018 | Lorenz | G01R 15/205 |
| 2019/0068045 A1* | 2/2019 | Ramabhadran | H05K 1/165 |

* cited by examiner

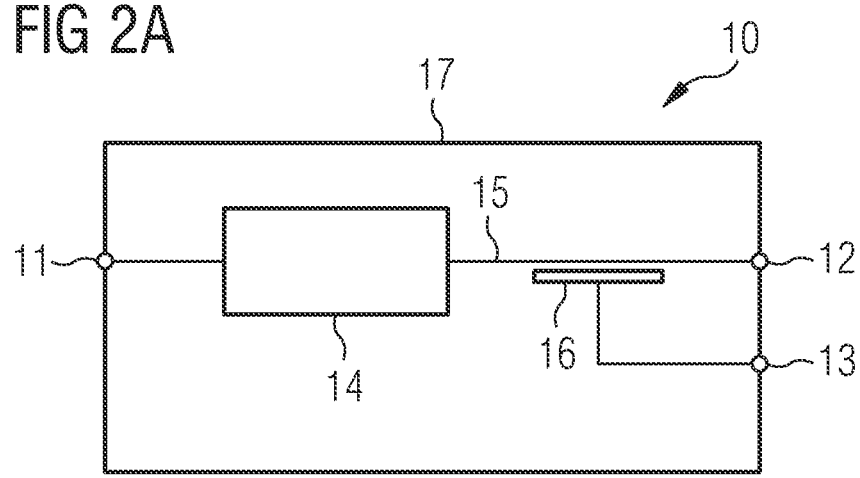
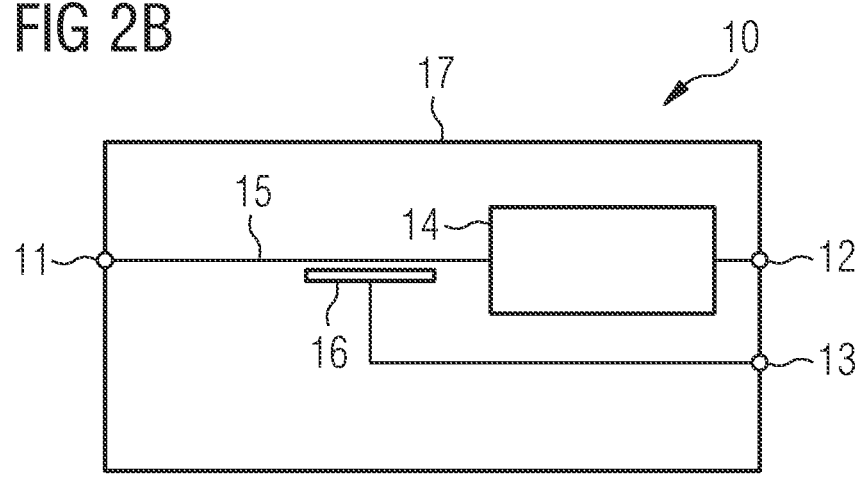
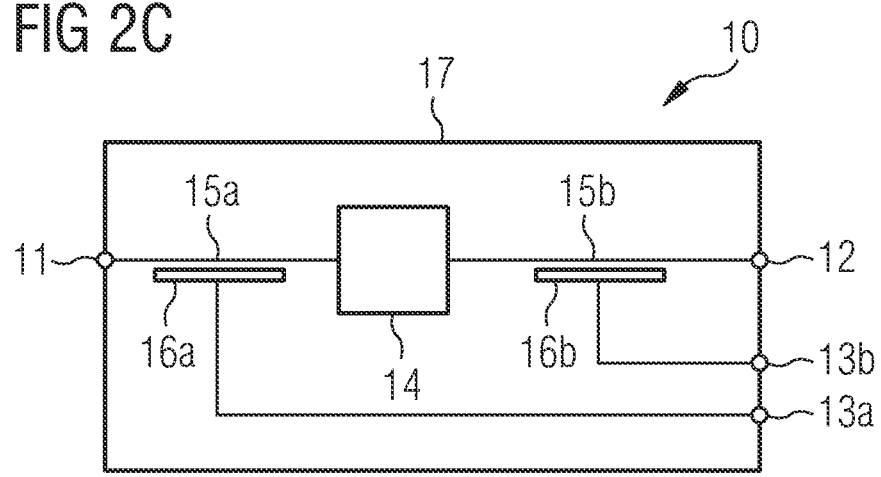

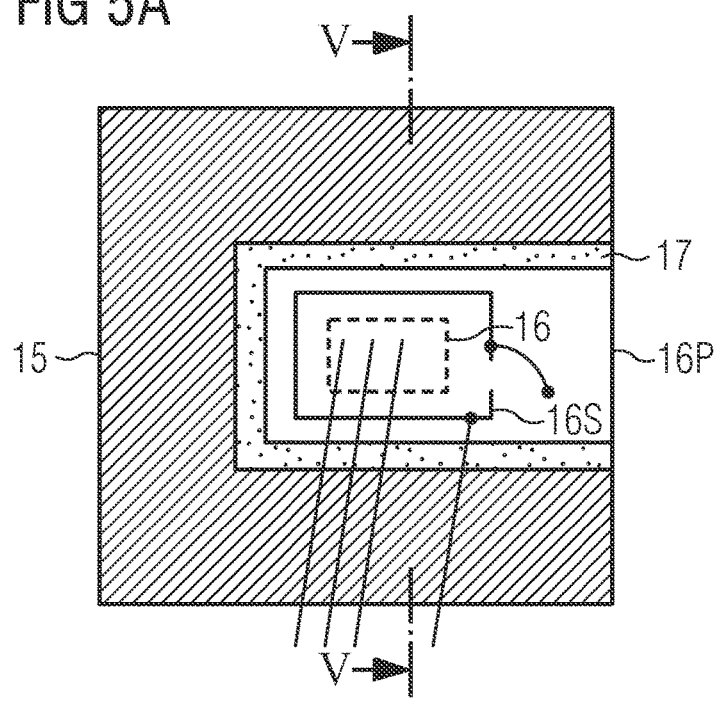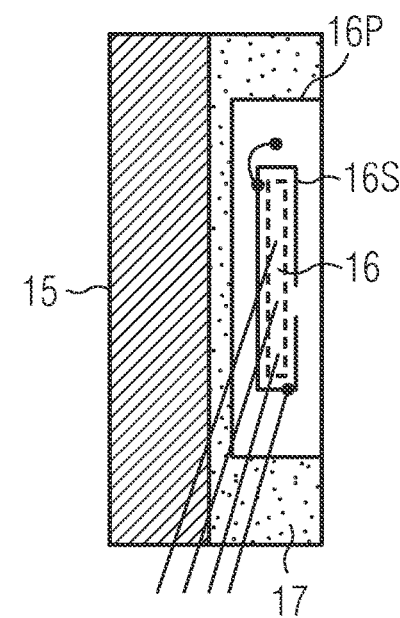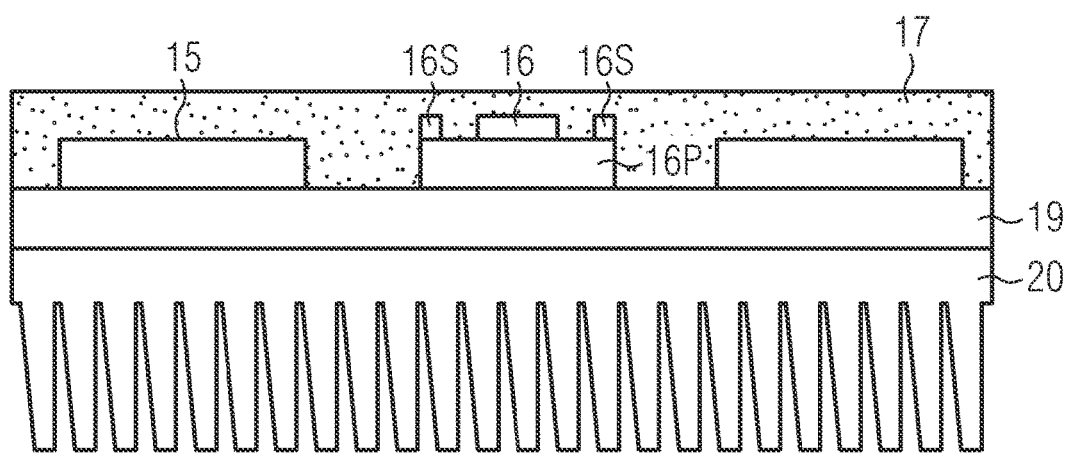

POWER SEMICONDUCTOR DEVICE WITH INTEGRATED CURRENT MEASUREMENT

BACKGROUND

To properly control power semiconductor devices and their connected loads, power semiconductor devices require current measurement. Commonly, to measure current in power semiconductor devices, external current sensing elements are used, such as shunts or magnetic sensor elements (e.g. Hall elements, xMR, open loop or closed loop magnetic transducers). While sensor cells, such as current mirrors, are a common solution for integrated current measurement devices, these can only be employed in unipolar low voltage devices, which have a nominal blocking voltage below 100V. In bipolar power semiconductor devices such as IGBTs, they are only capable of detecting overload or short circuit conditions due to their feeble linearity and limited accuracy. Bipolar power semiconductor devices such as IGBTs therefore require external current measurement devices, which leads to an increase in engineering effort as well as in space and cost.

Additionally, internal current measurement devices do not provide functional isolation of the measurement signal and the load current. In general, functionally isolated sensors are only available at higher costs, which make them incompatible with cost sensitive applications such as household appliances, electric hand tools or the like.

Therefore, there is the need for a low-cost power semiconductor device comprising an internal current measurement device, which is functionally isolated.

The internal current measurement device needs to measure the load current, of which the corresponding voltage swings between the positive and negative supply voltages with steep transients in the range of several kV/µs. Thus, as power semiconductor devices are operated with steep current and voltage transients, there is furthermore the need to insulate the sensor signal of the internal current measurement device from the interferences generated by these transients.

SUMMARY

To solve the above-mentioned issues, a package-integrated power semiconductor device is proposed, which includes at least one power transistor coupled to a current path, a current measurement device, and a package, wherein the current measurement device is electrically insulated from and magnetically coupled to the current path, wherein the current path and the current measurement device are arranged so as to enable the current measurement device to sense the magnetic field of a current flowing through the current path, and wherein the power switch, the current sensor and the current path are arranged inside the package.

In some embodiments of the package-integrated power semiconductor device, the current measurement device may be arranged to extend along a length of the current path.

In some embodiments of the package-integrated power semiconductor device, the current measurement device may be arranged to at least partially surround the current measurement device.

In some embodiments of the package-integrated power semiconductor device, the current measurement device may be arranged to at least partially surround the current measurement device on three sides.

In some embodiments of the package-integrated power semiconductor device, a section of the current path may be U-shaped and the current measurement device may be arranged inside the U-shaped section of the current path.

In some embodiments of the package-integrated power semiconductor device, the at least one power transistor and the current measurement device may be arranged on separate die pads.

In some embodiments of the package-integrated power semiconductor device, the die pad, on which the current sensor may be arranged, may be coupled to a reference potential.

In some embodiments of the package-integrated power semiconductor device, the package may include an electrically insulating mold compound, wherein the mold compound may provide electrical insulation between the current measurement device and the current path.

In some embodiments, the package-integrated power semiconductor device may further include a thermally conducting insulator, and the package, the at least one transistor and the current path may be arranged on the thermally conducting insulator.

In some embodiments of the package-integrated power semiconductor device, the thermally conducting insulator may include an inorganic material including at least one of the following materials: $SiO_2$, $Al_2O_3$, AlN, $Si_3N_4$.

In some embodiments of the package-integrated power semiconductor device, the current measurement device may include a sensor element configured to detect the magnetic field generated by the current flowing through the current path.

In some embodiments of the package-integrated power semiconductor device, the sensor element may include at least two magneto-resistive elements.

In some embodiments of the package-integrated power semiconductor device, the at least one power transistor and the current measurement device may be arranged on separate die pads and the at least two magneto-resistive elements may be arranged on two opposing sides of the die pad, wherein one of the opposing sides is the side closest to the current path and the other one of the opposing sides is parallel thereto.

In some embodiments of the package-integrated power semiconductor device, the current sensor may include a metallic shielding path and the metallic shielding path may at least partially surround the sensor element.

In some embodiments of the package-integrated power semiconductor device, the metallic shielding path may include at least one opening on a side of metallic shielding path opposite the current path.

In some embodiments of the package-integrated power semiconductor device, the metallic shielding path may be coupled to a reference potential.

To solve the above-mentioned issues, further a power module assembly is proposed, which includes a package-integrated power semiconductor device as discussed above, and a heatsink, wherein the heatsink is bonded to the package-integrated circuit and wherein the heatsink is coupled to the power semiconductor device via an electrically insulating and thermally conducting interface.

To solve the above-mentioned issues, further a method for measuring a current in a package-integrated power semiconductor device is proposed, which includes at least one power transistor coupled to a current path, a current measurement device and a package, wherein the current sensor is electrically insulated from and magnetically coupled to the current path, wherein the current path and the current measurement device are arranged so as to enable the current measurement device to sense the magnetic field of a current flowing through the current path and wherein the power switch, the current sensor and the current path are arranged inside the package, wherein the method includes the steps of operating the at least one power transistor, measuring a current flowing through the current path with the current measurement device and providing a signal representing the measured current as an output of the package-integrated power semiconductor device with the current measurement device.

BRIEF DESCRIPTION OF THE DRAWINGS

The disclosure may be readily understood by the following detailed description in conjunction with the accompanying drawings.

FIGS. 2A, 2B and 2C illustrate an exemplary block diagram of a package-integrated power semiconductor device with an integrated current measurement device according to embodiments of the invention.

FIGS. 5A and 5B show a detailed view of a portion of the layout view of FIG. 4 according to embodiments of the invention.

FIG. 6 shows a cross-sectional view along line V-V in FIG. 5 according to embodiments of the invention.

DETAILED DESCRIPTION

Figure 1A:
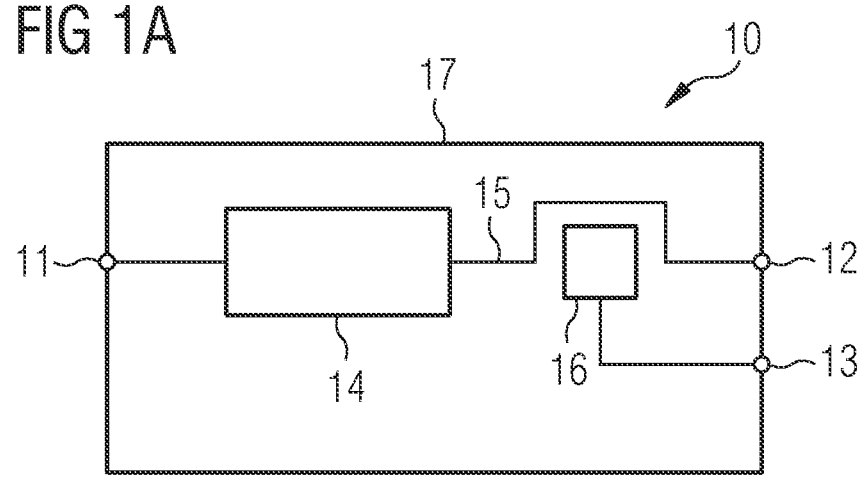
FIGS. 1A, 1B and 1C illustrate an exemplary block diagram of a package-integrated power semiconductor device with an integrated current measurement device according to embodiments of the invention.

Reference will now be made in detail to exemplary embodiments illustrated in the accompanying drawings. While the exemplary embodiments will be described with specific details, it should be nonetheless understood that the exemplary embodiments may be practiced without these specific details. Further, the following description of the exemplary embodiments is not intended to limit the present application to the exemplary embodiments. To the contrary, the application is to be construed to cover all alternatives, modifications, and equivalents as can be included within the scope of the described embodiments as defined by the appended claims. Further, features described with regard to one embodiment may be combined with features of other embodiments, even if such a combination of features is not explicitly described herein.

In the drawings, like reference signs designate like structural elements. To avoid unnecessary repetitions, a repeated description of elements having like reference signs is omitted. Thus, the descriptions provided for structural elements having like reference signs are applicable to all respective structural elements.

For the purpose of the description of the present invention, when elements are described as "connected" or "coupled" to another element, such description is intended to include both direct connections, i.e. without any intervening elements, and indirect connections, i.e. with any number of intervening elements, unless otherwise stated.

FIG. 1A shows an exemplary block diagram of a package-integrated power semiconductor device 10, which comprises a power transistor 14, a current measurement device 16 and a package 17. To interface with other devices, package-integrated power semiconductor device 10 further comprises an input 11 and two outputs 12 and 13. Power semiconductor device 14 is coupled to output 12 via a current path 15. Further, power semiconductor device 14 is coupled to input 11. Current measurement device 16 is coupled to output 13.

Power transistor 14, current measurement device 16 and current path 15 as well as the paths between input 11 and power transistor 14 and current measurement device 16 and output 13 are arranged inside package 17. Accordingly, power semiconductor device 10 is referred to as package-integrated as all elements of power semiconductor device 10 are arranged inside a package. Arranged inside package 17 in the context of the present invention means that generally all sides of all elements of package-integrated power semiconductor device 10 are covered by package 17. However, in some embodiments one or more sides of some elements may be left uncovered by package 17. Not covering one side of the elements may be used to provide a heat-exchange interface between the elements of package-integrated power semiconductor device 10 and components outside of package-integrated power semiconductor device 10, such as a heatsink. Thus, in some embodiments of the present invention, at least one side of the elements package-integrated power semiconductor device 10 may not be covered by package 17.

Package 17 may be made of any material providing electric insulation between the elements of package-integrated device 10 as well as between package-integrated device 10 and the outside of package-integrated device 10. In one example, package 17 may be a plastic molded over the elements of package integrated power semiconductor device 10, such as a thermosetting polymer.

Power transistor 14 may be any transistor typically used in the art to handle high currents (up to several tens or hundreds of Ampere) and/or high voltages (up to several tens, hundreds or thousands of Volt), such as an Insulated Gate Bipolar Transistor (IGBT), a Metal Oxide Semiconductor Field Effect Transistor (MOSFET) (e.g., Si MOSFET or SiC MOSFET), an enhancement-mode GaN Field Effect Transistor (eGaN FET) or a High Electron Mobility Transistor (HEMT). Therefore, it is to be understood that any specific type of power transistor shown in the appended drawings may readily be replaced with another type of power transistor.

While FIG. 1A only shows a single power transistor, package-integrated power semiconductor device 10 may comprise any number of power transistors and the single power transistor 14 in FIG. 1A is merely an example. Analogously, the amount of inputs and outputs of package-integrated power semiconductor device 10 shown in FIG. 1A is merely an example as the amount of outputs and inputs of package-integrated power semiconductor device 10 also depends on the amount of power transistors in package-integrated power semiconductor device 10, among other factors.

Current measurement device 16 may be any device configured to provide a signal indicative of a current flowing through current path 15 based on sensing the magnetic field generated by the current. To ensure that current measurement device 16 provides a signal indicative of a current flowing through current path 15, current measurement device 16 is electrically insulated from and magnetically coupled to current path 15. To this end, current path 15 and current measurement device 16 are arranged so as to enable current measurement device 16 to sense the magnetic field of a current flowing through current path 15. In the example of FIG. 1A, such an arrangement is achieved by arranging current path 15 to at least partially surround current measurement device 16. To sense the magnetic field, current measurement device 16 may in some embodiments comprise a sensor element configured to detect a magnetic field generated by the current flowing through current path 15. Examples of such sensor elements include, but are not limited to, Hall effect sensors, flux gate sensors or magneto-resistive current sensors, among others.

Different types of current measurement devices may require different arrangements of the current path. In one example, the current path partially surrounds the current measurement device by surrounding the current measurement device on three sides. In the example of FIG. 1A, to sense the magnetic field generated by the current flowing through current path 15, current path 15 includes a U-shaped section, in which current measurement device 16 is arranged. It will be understood that the current path of the package-integrated power semiconductor device of the present invention may be arranged as required by the specific type of current measurement device used so as to enable the respective type of current measurement device to be electrically insulated from and magnetically coupled to the current path. Further goals of the arrangement of the current path may include adjusting a certain measurement range of the current measurement device or ensuring immunity against disturbing background signals, such as a surrounding magnetic field or other noise caused by the operation of package-integrated power semiconductor device, among others. The specific arrangements discussed in the description and shown in the drawings are merely exemplary.

It should be noted that the current flowing through current path 15 may be either direct current or alternating current, depending on the respective application or operating conditions of package-integrated power semiconductor device 10.

Figure 1B:
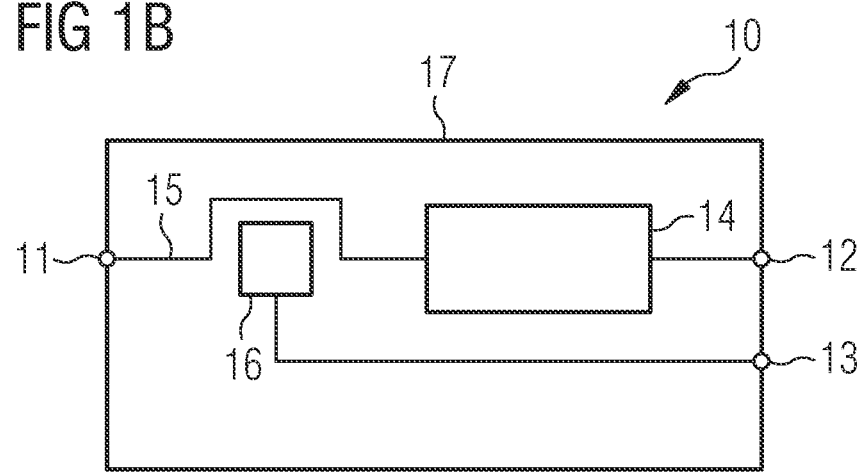
Figure 1C:
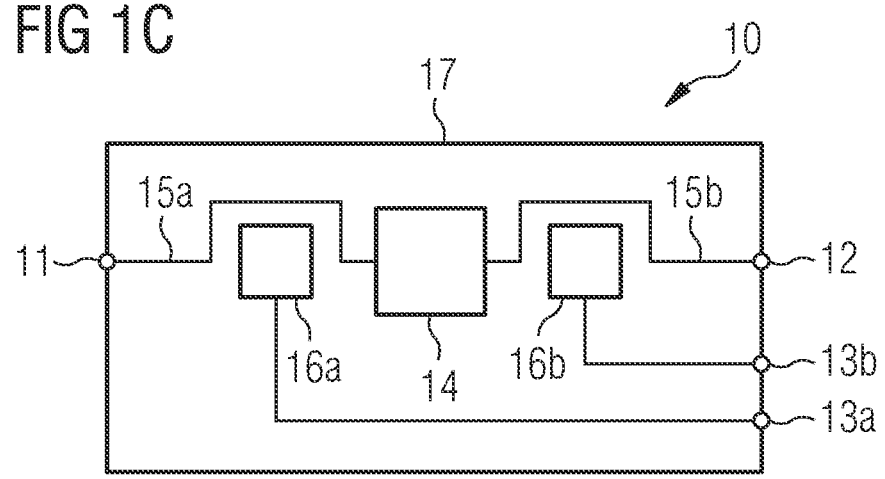

In FIG. 1A, current path 15 couples power transistor 14 to output 12 and accordingly current measurement device 16 measures the output current of power transistor 14. In a further example, FIG. 1B shows package-integrated power semiconductor device 10 in which current path 15 couples input 11 to power transistor 14. Thus, in the exemplary package-integrated power semiconductor device 10 of FIG. 1B, current measurement device 16 measures the input current of power transistor 14. FIG. 1C shows package-integrated power semiconductor device 10 comprising two current measurement devices 16a and 16b with corresponding current paths 15a and 15b and corresponding output pins 13a and 13b. Therefore, in the exemplary package-integrated power semiconductor device 10 of FIG. 1C, both the input current and the output current of power transistor 14 are measured. Accordingly, it is clear to the person skilled in the art that any number of current measurement devices may be included in package-integrated power semiconductor device 10 depending on the number of power transistors and current paths, which require current measurement.

FIGS. 2A to 2C show exemplary block diagrams of a package-integrated power semiconductor device 10 corresponding to the exemplary block diagrams of FIGS. A to 1C discussed above. FIGS. 2A to 2C illustrate a further example of an arrangement of current measurement device 16 and current path 15, which enables current measurement device 16 to sense the magnetic field of a current flowing through current path 15. In the example arrangement of FIGS. 2A to 2C, current measurement device 16 is arranged to extend along a length of current path 15. The length along which current measurement device 16 extends may depend on various factors, such as sensing requirements of the specific type of current measurement device used, the sensitivity of the specific type of current measurement device used or the sensing resolution required by the application in which package-integrated power semiconductor device 10 is used, such as tenths of Amperes or hundredths of Ampere. It should also be noted that the length shown in FIGS. 2A to 2C is merely an example and is not intended to imply a necessary length or a ratio of the length to the length of current path 15.

The two exemplary arrangements of current path 15 and current measurement device 16 shown in FIGS. 1A to 1C and FIGS. 2A to 2C to enable current measurement device 16 to sense the magnetic field of the current flowing through current path 15 may be used as required by the respective application of package-integrated power semiconductor device 10. The two exemplary arrangements may also be used concurrently in package-integrated power semiconductor device 10. For example, in the block diagrams of FIGS. 1C and 2C, one of the two arrangements of current path 15a and current measurement device 16a and of current path 15b and current measurement device 16b may be replaced by the respective other exemplary arrangement. Moreover, it is clear to the person skilled in the art that further arrangements of the current path and the current measurement device may be used depending on the type of the current measurement device as long as these arrangements enable sensing the magnetic field of the current flowing through the current path while ensuring electric insulation from the current path as well as immunity from any noise caused by the operation of package-integrated power semiconductor device.

Figure 3A:
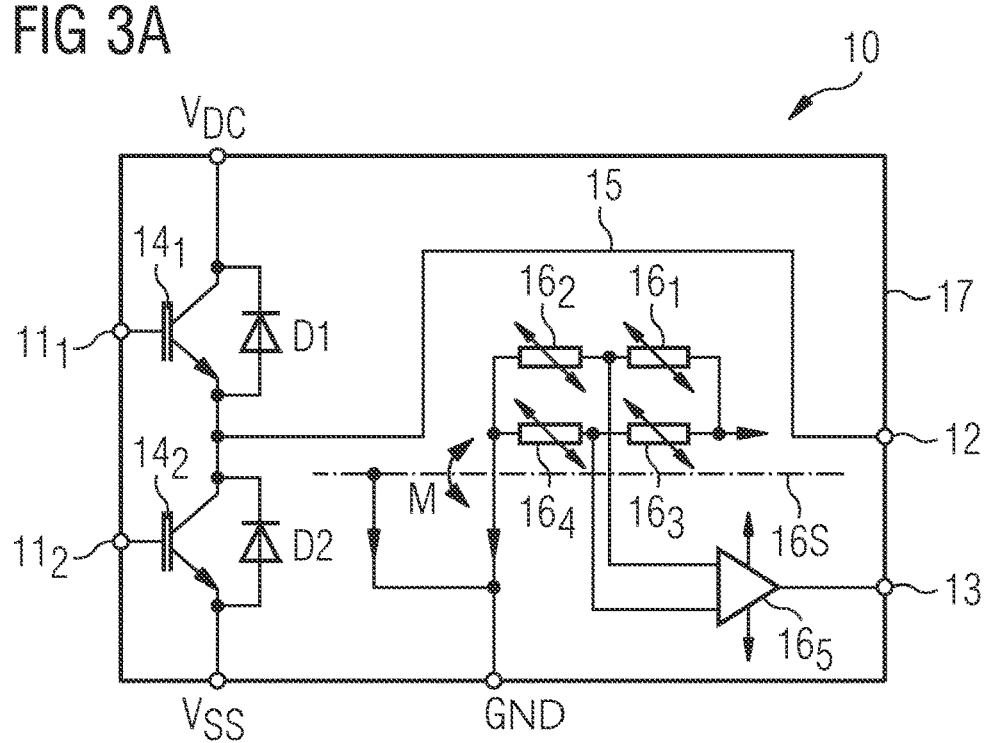
FIGS. 3A and 3B show a circuit diagram of a half bridge with an integrated current measurement device according to embodiments of the invention.
Figure 3B:
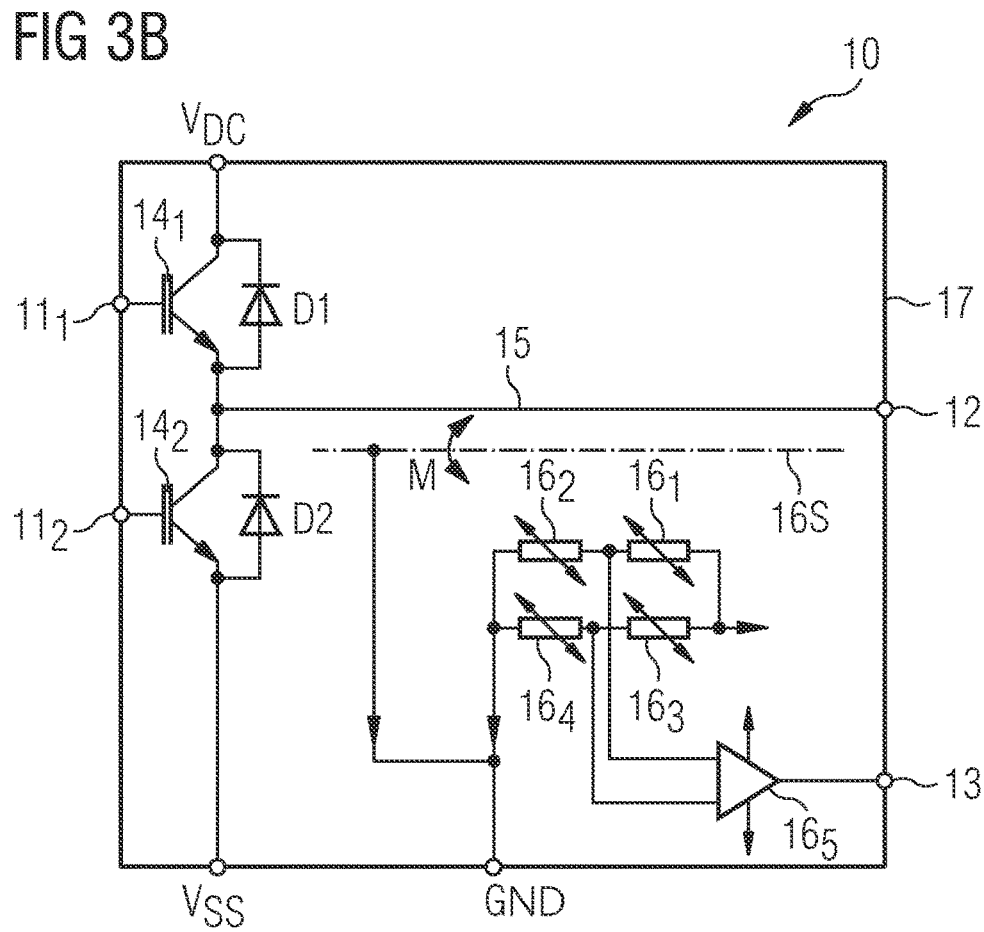

FIGS. 3A and 3B show a circuit diagram of an exemplary package-integrated power semiconductor device 10 with two power transistors $14_1$ and $14_2$ implementing a half-bridge. In addition to the elements discussed with regard to FIGS. 1A to 1C, package-integrated power semiconductor device 10 of FIGS. 3A and 3B comprises two freewheeling diodes D1 and D2, inputs $V_{DC}$, $V_{SS}$ and GND, which provide connections to respective reference potentials $V^{DC}$, $V_{SS}$ and GND, and individual elements of current measurement device 16, which will be discussed in more detail below. In some embodiments, freewheeling diodes D1 and D2 may be integrated in the corresponding power transistor $14_1$ and $14_2$, e.g. by providing IGBTs, power MOSFETs, GaN-FETs or HEMTs with monolithically integrated reverse-conduction capability. In some embodiments, freewheeling diodes D1 and D2 may be omitted if they are not necessary for the type of application in which the package-integrated power semiconductor device 10 is used.

Power transistors $14_1$ and $14_2$ in the example of FIGS. 3A and 3B are shown as IGBTs. However, any other suitable power transistor type, such as a power MOSFET, may be used, as discussed above with regard to FIG. 1A. The gates of power transistors $14_1$ and $14_2$ are coupled to inputs 11a and 11b of package-integrated power semiconductor device 10. Additionally, both power transistors $14_1$ and $14_2$ are coupled in parallel with respective freewheeling diodes D1 and D2. Inputs $V_{DC}$ and $V_{SS}$ are coupled to the collectors of power transistor $14_1$ and power transistor $14_2$, respectively. The emitters of power transistor $14_1$ and power transistor $14_2$ are coupled to current path 15. Current path 15 is thus coupled to the output node of the half bridge implemented by power transistors $14_1$ and $14_2$.

Current path 15 and current measurement device 16 in FIG. 3A are arranged according to the exemplary arrangement discussed with regard to FIGS. 1A to 1C. Therefore, current path 15 is arranged to at least partially surround current measurement device 16. In the example of FIG. 3A, current path 15 includes a U-shaped section, in which current measurement device 16 is arranged. In FIG. 3B, current path 15 and current measurement device 16 are arranged according to the exemplary arrangement discussed with regard to FIGS. 2A to 2C. Therefore, current measurement device 16 in FIG. 3B is arranged to extend along a length of current path 15. Since current path 15 of FIGS. 3A and 3B is coupled between the output node of the half bridge implemented by power transistors $14_1$ and $14_2$ and output 12, current measurement device 16 thus provides a signal indicative of the output current of the half bridge.

Current measurement device 16 in FIGS. 3A and 3B is a magneto-resistive current sensor comprising four magneto-resistive elements $16_1$ to $16_4$ arranged in an H-bridge configuration. As indicated by the arrows on all four magneto-resistive elements of current measurement device 16, magneto-resistive elements $16_1$ to $16_4$ change their resistance in the presence of a magnetic field, such as the magnetic field created by a current flowing through current path 15.

In the example of FIGS. 3A and 3B, current measurement device 16 comprises four magneto-resistive elements $16_1$ to $16_4$ arranged in an H-bridge to compensate for the non-linearity or variations of the resistors, which may be caused by e.g. temperature variations or by other disturbances. In addition to compensating for non-linearity or variations of the magneto-resistive elements $16_1$ to $16_4$, this H-bridge arrangement enables current measurement device 16 to compensate input disturbances, such as a common-mode magnetic field in the background or other magnetic noise caused by the operation of package-integrated power semiconductor device 10. Each half bridge is coupled to a reference potential via input GND. The reference potential may e.g. be system ground. Instead of input GND, each half bridge may also be coupled to input $V_{SS}$ and input GND may be omitted. The output of the two half bridges is provided to the inverting and the non-inverting input, respectively, of operational amplifier $16_5$ of current measurement device 16.

While FIGS. 3A and 3B show current measurement device 16 as comprising four magneto-resistive elements to compensate for input variations or variations of the magneto-resistive elements, such compensation may in some embodiments not be required and the current measurement device may comprise two magneto-resistive elements in a half bridge configuration or even only one magneto-resistive element. In these configurations, operational amplifier $16_5$ may be omitted or may be replaced by other elements to evaluate the value of the one or more magneto-resistive elements. Operational amplifier $16_5$ may be replaced or may be complemented by other means or combinations of analog or digital signal processing such as e.g. filtering, instrumentation amplifier or analog to digital converter (ADC).

Thus depending on the employed configuration, either the output signal of operational amplifier $16_5$, the processed output of operational amplifier $16_5$, the output of a single half bridge of current measurement device 16 or the output of a single magneto-resistive element is indicative of the current flowing through current path 15 due to the change in resistance of the magneto-resistive elements of current measurement device 16. Accordingly, the respective output providing the signal indicative of the current flowing through current path 15 is coupled to output 13.

It should be understood that the above-discussed configurations of a magneto-resistive current sensor are merely exemplary. Other configurations of a magneto-resistive current sensor may be used to implement current measurement device 16.

As indicated by the dashed line between current measurement device 16 and current path 15, current measurement device 16 may in some examples of the present invention comprise a metallic shielding path 16S to electrically decouple current measurement device 16 from current path 15, to e.g. protect current measurement device 16 from voltage changes in current path 15. In some examples of the present invention, metallic shielding path 16S may be coupled to a reference potential via input GND or via input $V_{SS}$.

Figure 4A:
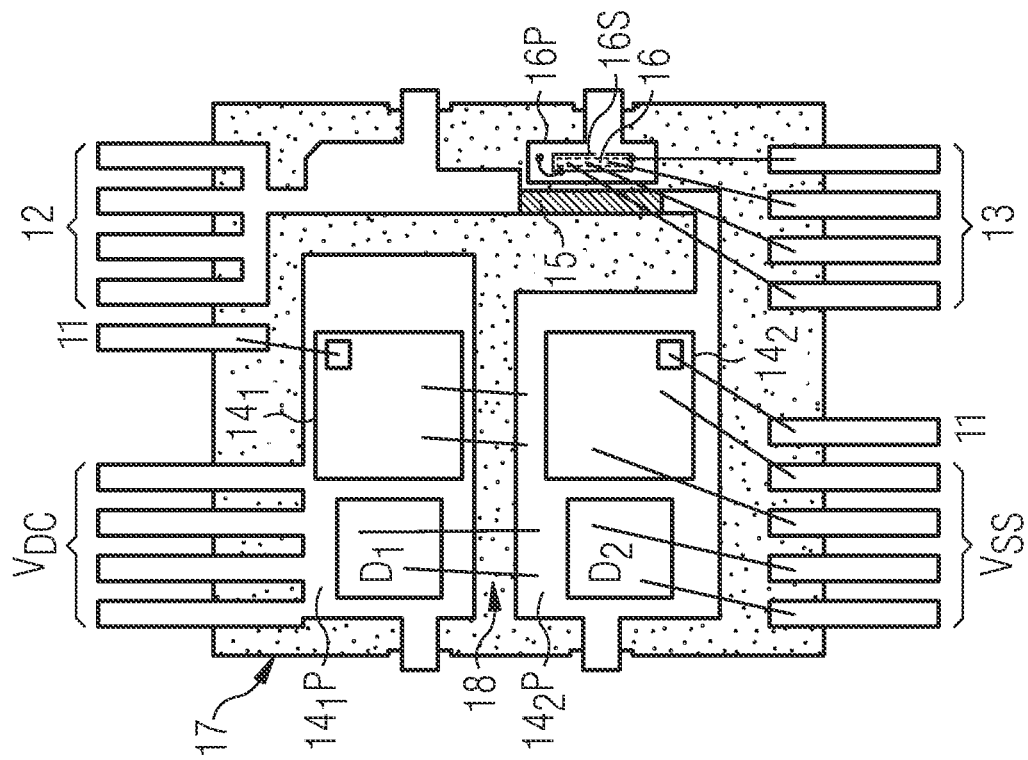
FIGS. 4A and 4B show a layout view of the circuit of FIG. 3 according to embodiments of the invention.
Figure 4B:
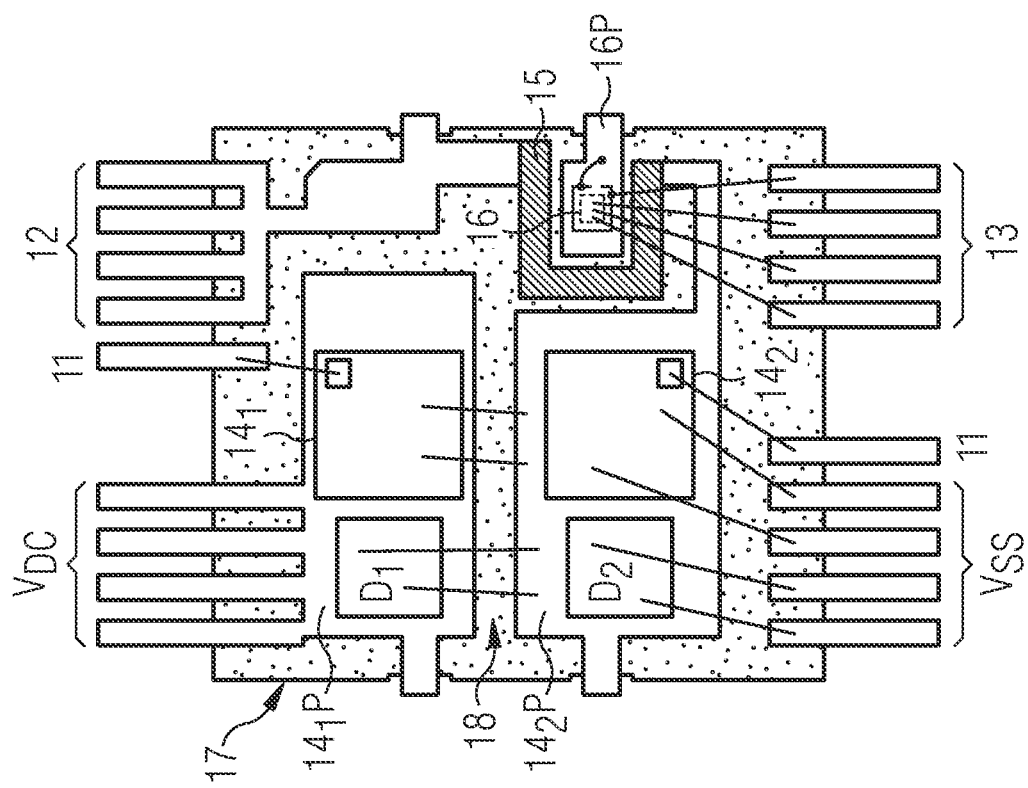

FIGS. 4A and 4B shows layout view of the package-integrated power semiconductor device 10 of FIGS. 3A and 3B. In FIG. 4A, current path 15 is arranged to at least partially surround current measurement device 16. In FIG. 4B, current measurement device 16 is arranged to extend along a length of current path 15. As can be seen in the layout view of FIGS. 4A and 4B, inputs 11a, 11b, $V_{DC}$ and $V_{SS}$ as well as outputs 12 and 13 may be formed by multiple pins. In the example layout of FIG. 3, power transistor $14_1$, power transistor $14_2$ and current measurement device 16 are arranged on separate die pads $14_1P$, $14_2P$ and 16P to electrically insulate power transistor $14_1$, power transistor $14_2$ and current measurement device 16 in order to ensure correct measurement of the magnetic field of the current flowing through current path 15. In embodiments including freewheeling diodes D1 and D2, diodes D1 and D2 are also arranged on corresponding die pads $14_1P$ and $14_2P$ of power transistors $14_1$ and $14_2$.

Die pad 16P of current measurement device 16 may be coupled to a reference potential via a pin of die pad 16P, which extends outside of package 17 of package-integrated power semiconductor device 10 in FIGS. 4A and 4B. This further electrically insulates current measurement device 16 and current path 15.

In the examples of FIGS. 4A and 4B, package-integrated power semiconductor device 10 comprises bond wires 18, which couple the die pads of power transistor 14, power transistor $14_2$ and current measurement device 16 to different inputs and outputs. Bond wires 18 may also couple the die pads of power transistor $14_1$ and of power transistor $14_2$ with one another to form the output node of the half bridge implemented by power transistors $14_1$ and $14_2$. The person skilled in the art will readily understand that other means for coupling the different die pads to one another as well as to the inputs and outputs of package-integrated power semiconductor device 10 may be used instead of bond wires 18.

Package 17 in FIGS. 4A and 4B is arranged around the different die pads, current paths and in between the die pads and current paths. In particular, package 17 in FIG. 3 is arranged between current path 15 and current measurement device 16 to provide electrical insulation between the two elements. To achieve this, package 17 comprises an electrically insulating mold compound, which is molded over all elements of package-integrated power semiconductor device 10 and thus also fills the gap between current path 15 and die pad 16P of current measurement device 16. The mold compound of package 17 thus provides electrical insulation between current path 15 and current measurement device 16. At the same time, the mold compound is permeable for the magnetic field generated by the current flowing through current path 15, thus enabling current measurement device 16 to be magnetically coupled to current path 15.

FIGS. 5A and 5B provide a more detailed view of the exemplary arrangements of current path 15 and current measurement device respectively shown in FIGS. 4A and 4B. In FIG. 5A, current path 15 partially surrounds current measurement device 16 and die pad 16P. In FIG. 5B, current path 15 extends along a length of current path 15. Specifically, the more detailed view provided by FIGS. 4A and 4B shows that package 17 may in some embodiments fill the gap between die pad 16P of current measurement device 16 and current path 15 to provide further electrical insulation between them. Additionally, FIG. 4 shows metallic shielding path 16S, which is arranged on die pad 16P to surround current measurement device 16. In some embodiments, metallic shielding path 16S may comprise at least one opening on a side of metallic shielding path 16S opposite current path 15, as shown in FIG. 4. Metallic shielding path 16S may be coupled to a reference potential via to further improve the electric insulation between current measurement device 16 and current path 15 provided by metallic shielding path 16S. The coupling to the reference potential may for example be achieved by coupling metallic shielding path to die pad 16P, which in turn may be coupled to GND or another reference potential via the pin of die pad 16P. In addition, or alternatively, output 13 may include a reference voltage pin, which may be coupled to metallic shielding path 16S.

FIG. 6 shows a cross-sectional view of FIG. 5A along line V-V shown in FIG. 5A. As can be seen in this cross-sectional view, current path 15 and die pad 16P of current measurement device 16 may in some embodiments of the present invention be arranged on thermally conducting insulator 19. Thermally conducting insulator 19 provides a thermal interface for a heatsink 20 to enable the dissipation of heat generated during the operation of package-integrated power semiconductor device 10. Further as thermally conducting insulator 19 is electrically insulating, thermally conducting insulator 19 may prevent leakage currents between current path 15 and die pad 16P of current measurement device 16 and may thus provide insulation between current path 15 and current measurement device 16. In some embodiments, thermally conducting insulator 19 may comprise an inorganic material including at least one of $SiO_2$, $Al_2O_3$, AlN, $Si_3N_4$, a polyimide or an epoxy resin. Additionally, or alternatively to these materials, other potting materials may be used, such as silicone gels.

While FIG. 6 shows a cross-sectional view along line A-A of FIG. 5A and thus shows current path 15 on both sides of current measurement device 16, it is clear to the person skilled in the art from the preceding description that the cross-sectional view of FIG. 5B would in principle show the same arrangement as FIG. 5A with the only difference that current path 15 would only be shown on one side of current measurement device 16.

In some embodiments of the present invention, the entirety of package-integrated power semiconductor device 10 may be arranged on thermally conducting insulator 19. In some embodiments, only certain parts of package-integrated power semiconductor device 10 may be arranged on thermally conducting insulator 19, such as die pads $14_1P$, $14_2P$ and 16P as well as current path 15. In some embodiments, thermally conducting insulator 19 may be omitted and package 17 covers all sides of all elements of package-integrated power semiconductor device 10.

Figure 7A:
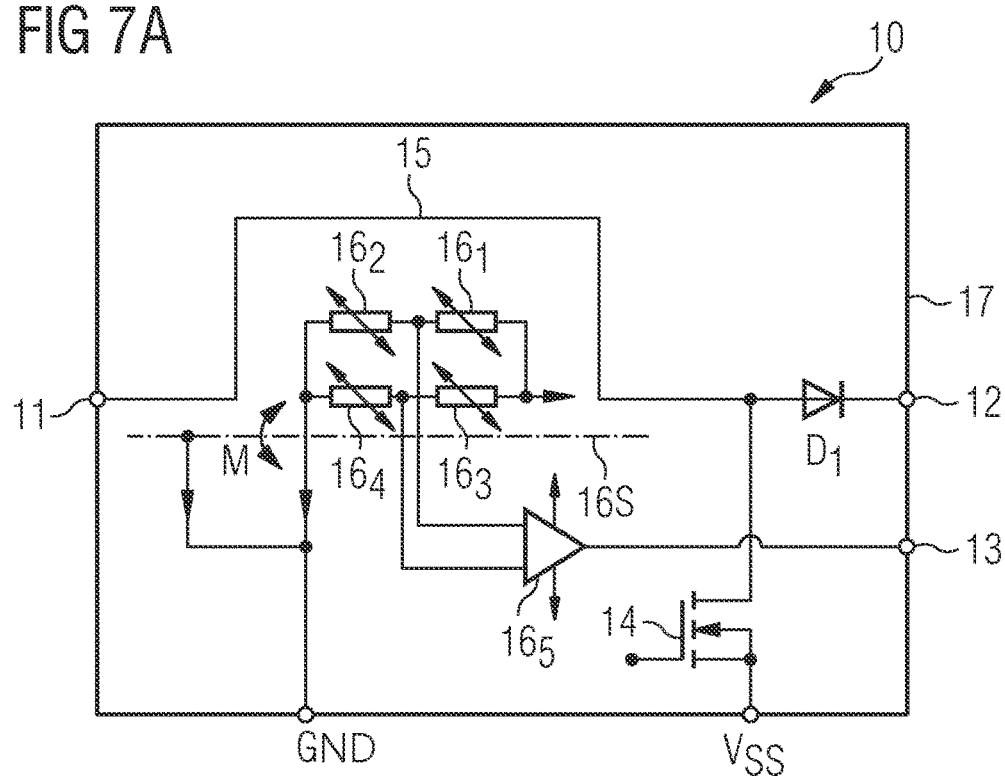
FIGS. 7A and 7B show a circuit diagram of a boost converter with an integrated current measurement device according to embodiments of the invention.
Figure 7B:
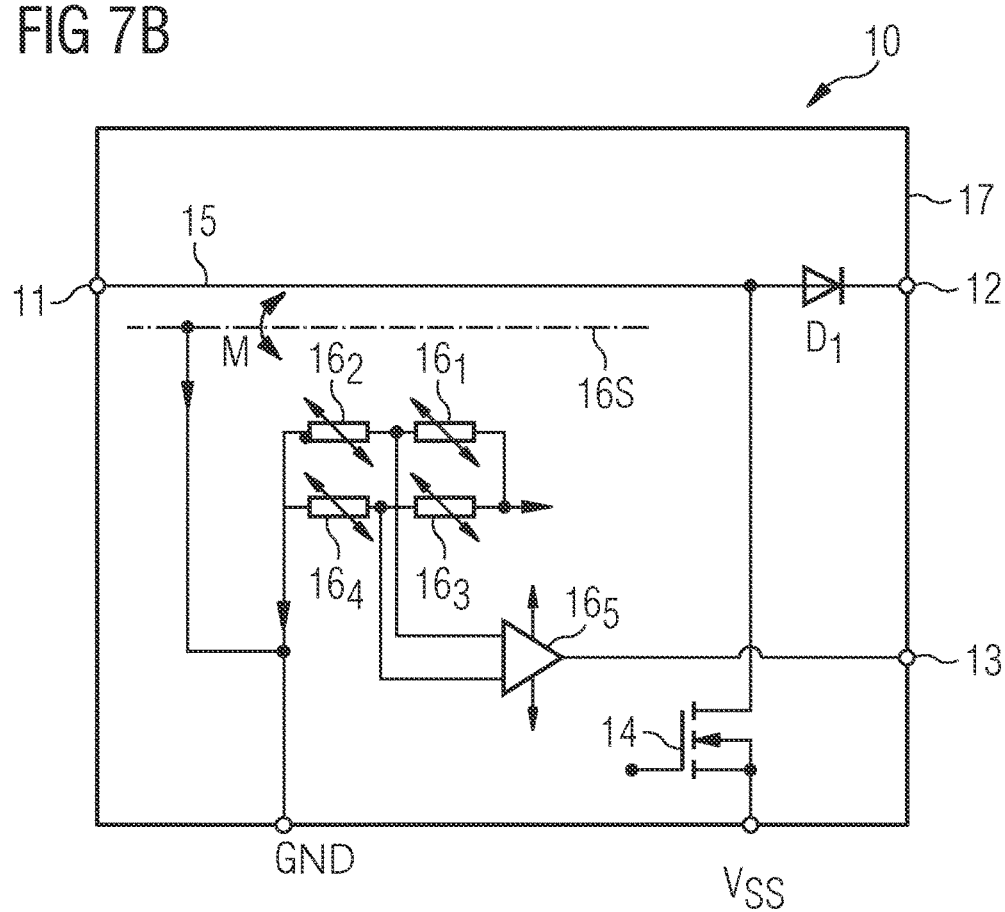

FIGS. 7A and 7B shows a circuit diagram of package-integrated power semiconductor device 10 implementing a boost converter. In this example, package-integrated power semiconductor device 10 comprises one power transistor 14 and current path 15 is coupled between input 11 as well as the emitter of power transistor 14 and the anode of diode D1. Exemplary package-integrated power semiconductor device 10 of FIGS. 7A and 7B thus respectively corresponds to package-integrated power semiconductor device 10 of FIGS. 1B and 2B in that current measurement device 16 inside package-integrated power semiconductor device 10 is used to provide a signal indicative of an input current.

Figure 8A:
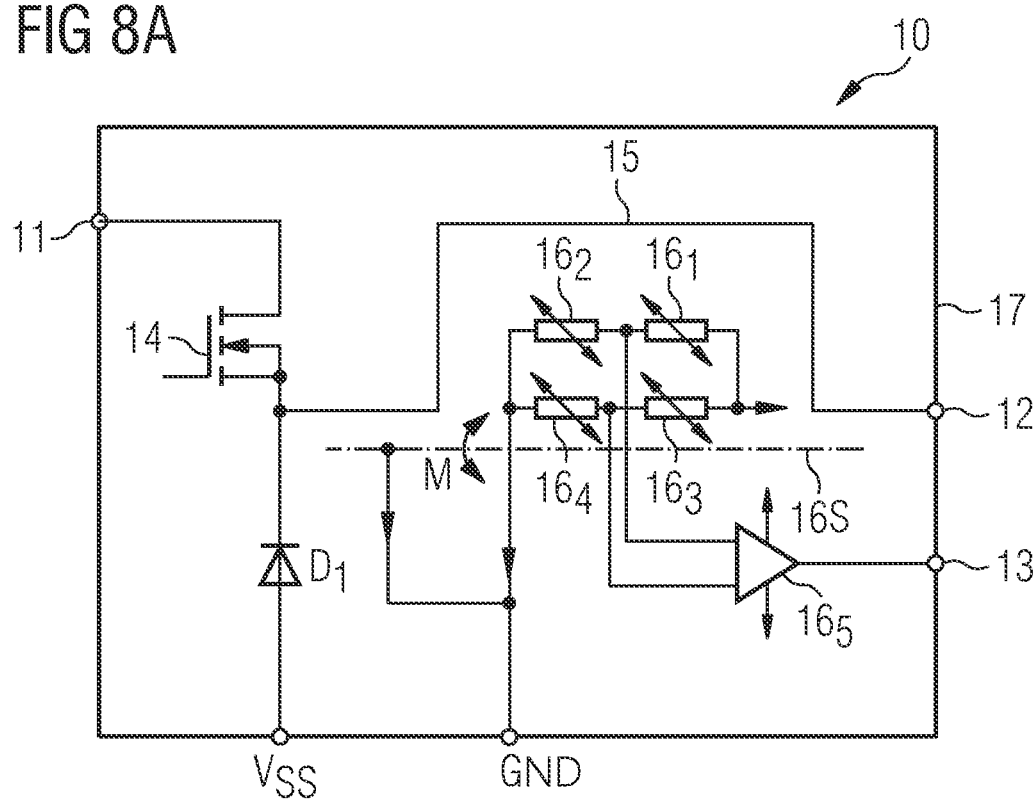
FIGS. 8A and 8B show a circuit diagram of a buck converter with an integrated current measurement device according to embodiments of the invention.
Figure 8B:
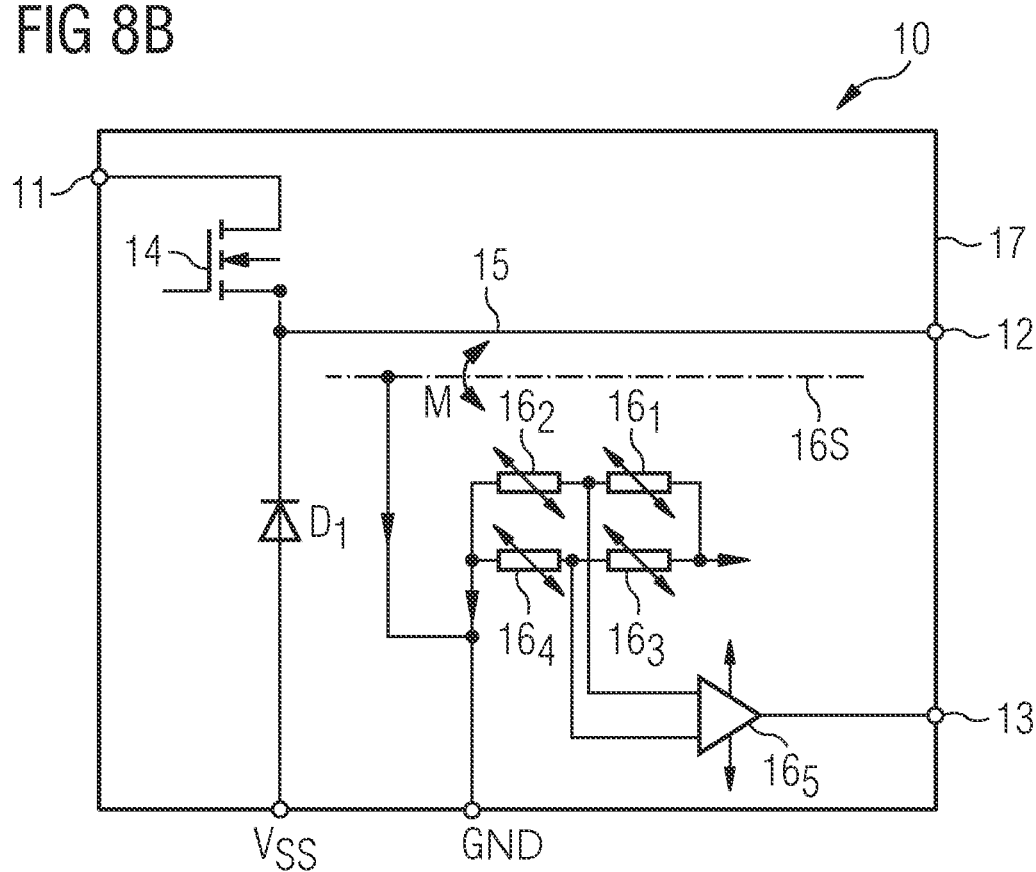

FIGS. 8A and 8B show a circuit diagram of package-integrated power semiconductor device 10 implementing a buck converter. In this example, package-integrated power semiconductor device 10 comprises one power transistor 14 and current path 15 is coupled between the collector of power transistor 14 and the cathode of diode D1 as well as output 12. Thus, package-integrated power semiconductor device 10 of FIGS. 8A and 8B respectively corresponds to package-integrated power semiconductor device 10 of FIGS. 1A and 2A. FIGS. 8A and 8B therefore show an exemplary circuit implemented by package-integrated power semiconductor device according to the present invention comprising a single power transistor 14 and using current measurement device 16 inside package-integrated power semiconductor device 10 to provide a signal indicative of an output current.

FIGS. 3, 7 and 8 provide examples of possible power circuits, which may be implemented in the package-integrated power semiconductor device according to the present invention. It will be understood by the person skilled in the art that any possible power circuit including any number of power transistors as required by the respective circuit may be implemented in the package-integrated power semiconductor device according to the present invention.

Additionally, it should be understood that the various measures disclosed in this application to achieve electric insulation between the current measurement device and the current path while allowing magnetic coupling there between inside the package of the package-integrated power semiconductor device of the present invention may be employed individually or in any combination as warranted by the respective specification of the circuit to be implemented in the package-integrated power semiconductor device of the present invention. Further, the measures to achieve electric insulation between the current measurement device and the current path of the package-integrated power semiconductor device of the present invention are not limited to those explicitly disclosed in the preceding detailed description. Rather, it will be clear to the person skilled in the art that both the measures explicitly disclosed as well as other measures or combination of measures not explicitly disclosed in the preceding detailed description to achieve electric insulation between the current measurement device and the current path while allowing magnetic coupling there between are intended to be covered by the scope of the appended claims and their legal equivalents.

What is claimed is:

1. A package-integrated power semiconductor device, comprising:
   at least one power transistor coupled to a current path;
   a current measurement device; and
   at least one gap formed laterally between the current measurement device and the current path;
   a package;
   wherein the current measurement device is electrically insulated from the current path and is magnetically coupled to the current path,
   wherein the current path and the current measurement device are arranged so as to enable the current measurement device to sense the magnetic field of a current flowing through the current path, wherein the at least one power transistor, the current measurement device, and the current path are arranged inside the package, wherein the package comprises an electrically insulating mold compound disposed on the at least one power transistor, the current measurement device, and the current path, wherein the electrically insulating mold compound provides electrical insulation between the current measurement device and the current path, and wherein the electrically insulating mold compound fills the at least one gap between the current measurement device and the current path.

2. The package-integrated power semiconductor device of claim 1, wherein the current measurement device is arranged to extend along a length of the current path.

3. The package-integrated power semiconductor device of claim 1, wherein the current path is arranged to at least partially surround the current measurement device.

4. The package-integrated power semiconductor device of claim 3, wherein the current path is arranged to at least partially surround the current measurement device on three sides.

5. The package-integrated power semiconductor device of claim 4, wherein a section of the current path is U-shaped having an interior volume defined by the U-shape and wherein the current measurement device is arranged inside the interior volume of the U-shaped section of the current path.

6. The package-integrated power semiconductor device of claim 1, wherein the at least one power transistor and the current measurement device are arranged on separate die pads.

7. The package-integrated circuit of claim 1, further comprising:
a thermally conducting electrical insulator,
wherein the package, the at least one transistor, the current measurement device, and the current path are arranged on the thermally conducting electrical insulator and are interposed between the thermally conducting electrical insulator and the electrically insulating mold compound.

8. The package-integrated power semiconductor device of claim 7, wherein the thermally conducting electrical insulator comprises an inorganic material including at least one of the following materials: $SiO_2$, $Al_2O_3$, $AlN$, $Si_3N_4$.

9. The package-integrated circuit of claim 7, wherein the electrically insulating mold compound is arranged in contact with the current measurement device and the current path and is further arranged in contact with the thermally conducting insulator at the at least one gap formed laterally between the current measurement device and the current path.

10. The package-integrated power semiconductor device of claim 1, wherein the current measurement device comprises a sensor element configured to detect the magnetic field generated by the current flowing through the current path.

11. The package-integrated power semiconductor device of claim 10, wherein the sensor element comprises at least two magneto-resistive elements.

12. The package-integrated power semiconductor device of claim 10, wherein the current measurement device comprises a metallic shielding path and wherein the metallic shielding path at least partially surrounds the sensor element.

13. The package-integrated power semiconductor device of claim 1, wherein the electrically insulating mold compound has shape that conforms to the current measurement device, the current path, and the at least one gap formed laterally between the current measurement device and the current path.

14. A package-integrated power semiconductor device, comprising:
at least one power transistor coupled to a current path;
a current measurement device; and
a package;
wherein the current measurement device is electrically insulated from the current path and magnetically coupled to the current path,
wherein the current path and the current measurement device are arranged so as to enable the current measurement device to sense the magnetic field of a current flowing through the current path, and
wherein the at least one power transistor, the current measurement device, and the current path are arranged inside the package,
wherein the current measurement device comprises a sensor element configured to detect the magnetic field generated by the current flowing through the current path,
wherein the sensor element comprises at least two magneto-resistive elements,
wherein the at least one power transistor and the current measurement device are arranged on separate die pads,
wherein the at least two magneto-resistive elements are arranged on two opposing sides of the die pad, and
wherein one of the two opposing sides is a side closest to the current path and the other one of the two opposing sides is parallel thereto.

15. A power module assembly, comprising:
a package-integrated power semiconductor device comprising:
at least one power transistor coupled to a current path;
a current measurement device; and
at least one gap formed laterally between the current measurement device and the current path;
a package;
wherein the current measurement device is electrically insulated from the current path and is magnetically coupled to the current path,
wherein the current path and the current measurement device are arranged so as to enable the current measurement device to sense the magnetic field of a current flowing through the current path, and
wherein the at least one power transistor, the current measurement device, and the current path are arranged inside the package,
wherein the package comprises an electrically insulating mold compound disposed on the at least one power transistor, the current measurement device, and the current path,
wherein the electrically insulating mold compound provides electrical insulation between the current measurement device and the current path, and
wherein the electrically insulating mold compound fills the at least one gap between the current measurement device and the current path;
a heatsink; and an electrically insulating and thermally conducting interface that couples the package-integrated power semiconductor device to the heatsink such that the heatsink is bonded to the package-integrated power semiconductor device.

16. The power module assembly of claim 15, wherein the electrically insulating and thermally conducting interface is coupled to the current path and to the current measurement device.

17. A method for measuring a current in a package-integrated power semiconductor device comprising at least one power transistor coupled to a current path, a current measurement device, at least one gap formed laterally between the current measurement device and the current path, and a package, wherein the current measurement device is electrically insulated from the current path and magnetically coupled to the current path, wherein the current path and the current measurement device are arranged so as to enable the current measurement device to sense a magnetic field of a current flowing through the current path, wherein the at least one power transistor, the current measurement device, and the current path are arranged inside the package, wherein the package comprises an electrically insulating mold compound disposed on the at least one power transistor, the current measurement device, and the current path, wherein the electrically insulating mold compound provides electrical insulation between the current measurement device and the current path, and wherein the electrically insulating mold compound fills the at least one gap between the current measurement device and the current path, the method comprising:

operating the at least one power transistor;

measuring a current flowing through the current path with the current measurement device; and providing a signal representing the measured current as an output of the package-integrated power semiconductor device with the current measurement device.

\* \* \* \* \*